United States Patent
Chen

(10) Patent No.: US 7,157,295 B2
(45) Date of Patent: Jan. 2, 2007

(54) METHOD OF MANUFACTURING LIQUID CRYSTAL DISPLAY

(75) Inventor: Hsin-Ming Chen, Hsinchu (TW)

(73) Assignee: TPO Displays Corporation, Miao-Li County (TW)

( * ) Notice: Subject to any disclaimer, the term of this patent is extended or adjusted under 35 U.S.C. 154(b) by 407 days.

(21) Appl. No.: 10/842,553

(22) Filed: May 11, 2004

(65) Prior Publication Data

US 2005/0255623 A1 Nov. 17, 2005

(51) Int. Cl.
*H01L 21/84* (2006.01)

(52) U.S. Cl. .................... 438/30; 257/E21.415

(58) Field of Classification Search ............ 438/30, 438/151–166; 257/E21.415
See application file for complete search history.

(56) References Cited

FOREIGN PATENT DOCUMENTS

| JP | 11-218788 A | 8/1999 |
|----|-------------|--------|
| JP | 2001-060693 A | 3/2001 |
| TW | 1234030 B | 6/2005 |

*Primary Examiner*—Richard A. Booth
(74) *Attorney, Agent, or Firm*—Sughrue Mion, PLLC

(57) ABSTRACT

A conductive layer, a metal layer and a doped layer are sequentially formed on a glass substrate. A CMOS circuit region, a transistor region, a reflective region, a transmission region and a capacitor region are defined. Next, a polysilicon layer and an insulating layer are formed to serve as a source/drain region, a channel region and a gate insulating layer. Then, a resin layer with a rough surface is formed. Next, a metal layer is formed to serve as a gate structure and a reflective electrode. Then, an ion implanting process is performed to form the source/drain structure of a PMOS. Then, a passivation layer is formed to define a transmission region. Finally, the metal layer and the doped layer are removed to expose the conductive layer.

18 Claims, 12 Drawing Sheets

METHOD OF MANUFACTURING LIQUID CRYSTAL DISPLAY

FIELD OF THE INVENTION

The present invention relates to a method for manufacturing a liquid crystal display, and more particularly to a method for manufacturing a liquid crystal display having a reflection region and a transmission region.

BACKGROUND OF THE INVENTION

Liquid crystal displays (LCDs) have been widely applied in electronic products, such as digital watches and calculators, for a long time. With the advance of techniques for manufacture and design, the thin film transistor liquid crystal displays (TFT-LCDs) have been introduced into portable computers, personal digital assistants and color televisions, and have gradually replaced the kinescopes that are used for conventional displays. However, consequent of the TFT-LCD design rules trend toward large scale, there are a lot of problems and challenges, such as low yields and low throughput, in manufacturing and developing TFT-LCD apparatuses.

In general, the TFT-LCD comprises a bottom plate on which thin film transistors and pixel electrodes are formed, and a top plate on which color filters are constructed. The liquid crystal molecules are filled between the top plate and the bottom plate. During operation, a signal voltage is applied to the TFT, which is the switching element of each pixel unit. The TFT receives the signal voltage and it turns on so that data voltage carrying image information can be applied to the corresponding pixel electrode and the liquid crystal via the TFT. When the data voltage is applied to the TFT, the orientation of the liquid crystal molecules is changed, thereby altering the optical properties and displaying the image. Generally, the voltage applied to the pixel electrode is from the signal line coupled to the corresponding TFT that is switched by the voltage from the gate line.

There is an ongoing requirement to reduce the photolithography processes in manufacturing TFT devices in order to decrease the process cycle time and cost. Namely, it is better to reduce the number of photomasks used in forming the TFT devices.

According to the prior art of concurrently manufacturing the thin film transistor and the peripheral CMOS transistor (Complementary Metal-Oxide Semiconductor) control circuit for a reflection type or transmission type TFT-LCD, eight or more photomasks are needed. The cost incurred by employing this conventional manufacturing method is thus significant and its reduction is required for a manufacturer to remain competitive.

FIG. 1 illustrates the structure of the thin film transistor 200 and the peripheral CMOS control circuit 202 that are formed over a glass substrate 100 according to the conventional method. First, a polycrystalline thin film is deposited over a glass substrate 100 to define the location and scale of active region structures 101, 102 and 103 of the thin film transistor 200 and the peripheral CMOS transistor control circuit 202, wherein the active region structures 102 and 103 are respectively used to form the PMOS (P-type Metal-Oxide Semiconductor) transistor and the NMOS (N-type Metal-Oxide Semiconductor) transistor of the CMOS transistor. An insulating layer 104 is formed on the glass substrate 100 to cover the active region structures 101, 102 and 103. A gate structure 106 is formed above the insulating layer 104 and the active region structures 101, 102 and 103.

Next, an ion implanting step is performed to form the N+ doped polysilicon layer 108 in the active region structures 101 and 102. Another ion implanting step is performed to form the P+ doped polysilicon layer 110 in the active region structure 103. A step for forming the lightly doped drain (LDD) region 124 may be performed before the step of forming the N+ doped polysilicon layer 108. Then, an ILD (interlayer dielectric) layer 112 is formed over the insulating layer 104. An etching step is performed to form the via and contact window and fill them with a metal to act as the source/drain electrode 114. A passivation layer 116 is deposited over the ILD layer 112, which has a contact hole to expose the surface of the source/drain electrode 114. Then, an indium tin oxide (ITO) layer 122 is deposited on the passivation layer 116 to form the pixel electrode and connect to the source/drain electrode 114. Finally, an electrical connection is made between the thin film transistor 200 and the peripheral CMOS control circuit 202.

It is noted that the TFT device 200 and the peripheral CMOS transistor control circuit 202 as illustrated in FIG. 1 are manufactured by using nine photomasks. The first photomask is used to define the active region structures 101, 102 and 103. The second photomask is used to define the gate structure 106. The third photomask is used to define the NMOS transistor region of the peripheral CMOS transistor control circuit 202 and the TFT regions. The lightly doped drain (LDD) region 124 is also defined in this step. The fourth photomask is used to define the N+ doped polysilicon layer 108. The fifth photomask is used to define the PMOS transistor region of the peripheral CMOS transistor control circuit 202. The P+ doped polysilicon layer 110 is also defined in this step. The sixth photomask is used to define the via of the ILD layer 112. The seventh photomask is used to define the pattern of the source/drain electrode 114. The eighth photomask is used to define the contact hole 120 of the passivation layer 116. The ninth photomask is used to define the pattern of the ITO layer 122. Although the TFT device 200 and the peripheral CMOS transistor control circuit 202 as illustrated in FIG. 1 may be manufactured by using these nine photomasks, much process cycle time and cost are incurred.

SUMMARY OF THE INVENTION

The more photomasks used in manufacturing a TFT device, the more process cycle time and cost are incurred. Misalignment risk is also increased. Therefore, a method is required for manufacturing the thin film transistor and the peripheral CMOS transistor control circuit without involving a lot of photolithography processes. Moreover, a liquid crystal display structure with transmission regions and reflection regions is also required so that partial incident light can pass through a transmission region while other incident light can be reflected by a reflection region. Such a structure can be used in a darker environment.

The present invention is to provide a method of using six photomasks to manufacture a thin film transistor and a peripheral CMOS transistor control circuit.

In one aspect, the present invention is to provide a method of using six photomasks to manufacture a liquid crystal display structure with transmission regions and reflection regions.

In another aspect, the present invention is to provide a method of manufacturing a thin film transistor and a peripheral CMOS transistor control circuit in which the process cycle time and cost is reduced.

In accordance with the foregoing purposes, the present invention discloses a manufacturing method of a liquid crystal display. The method comprises the following steps. First, a conductive layer is formed over a substrate. A first metal layer is formed over the conductive layer. A heavily doped layer is formed over the first metal layer. Then, the conductive layer, the first metal layer and the heavily doped layer are patterned to define the peripheral control circuit region, a transistor region, a reflection region, a transmission region and a capacitor region. A semiconductor layer is formed over the substrate and the heavily doped layer. An insulating layer is formed over the semiconductor layer. Then, the insulating layer, the semiconductor layer and the heavily doped layer are patterned to define a source/drain region and a channel region and to partially expose the first metal layer. A resin layer is formed over the substrate, the first metal layer and the insulating layer. The resin layer is patterned to make the surface of the resin layer in the reflection region non-uniform. A thermal process is performed to soften the non-uniform surface so as to form a smooth surface. A second metal layer is formed over the resin layer, the substrate, the first metal layer and the insulating layer. The second metal layer is patterned to define a gate electrode structure, a reflection electrode and a capacitor electrode. Then, a photoresist is formed and is patterned over the gate electrode structure, the reflection electrode, the substrate, the first metal layer, the capacitor electrode and the insulating layer. Next, ions are implanted into the peripheral control circuit region to form the source/drain region using the patterned photoresist as a mask. Then, the photoresist is removed. A passivation layer is formed over the gate electrode structure, the reflection electrode, the substrate, the first metal layer, the capacitor electrode and the insulating layer. Finally, the passivation is patterned to expose the transmission region, and the first metal layer is partially etched to expose the conductive layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Without limiting the spirit and scope of the present invention, the method proposed in the present invention is illustrated with one embodiment of forming thin film transistors and the peripheral CMOS transistor control circuit in a TFT-LCD. Skilled artisans, upon acknowledging the embodiments, can apply the present invention to any kind of TFT apparatus to reduce the process cycle time and the cost required to manufacture the TFT-LCD. Moreover, according to the present invention, a TFT-LCD with transmission regions and reflection regions can also be formed by using the same photolithography process. In such a structure, partial incident light can pass through the transmission region while other incident light is reflected by the reflection region in order to maximize the light-utilization efficiency in the two regions. Therefore, this structure can be used in a darker environment. The usage of the present invention is not limited by the embodiment that follows.

The present invention provides a method for manufacturing thin film transistors and the peripheral CMOS transistor control circuit in a TFT-LCD. In accordance with the present invention, only six photolithography processes are necessary to form the thin film transistors and the peripheral CMOS transistor control circuit. Therefore, the process cycle time and the cost can be reduced. Moreover, the present invention also provides a liquid crystal display structure with transmission and reflection regions. The manufacturing method of the present invention is described as follows.

Figure 1:
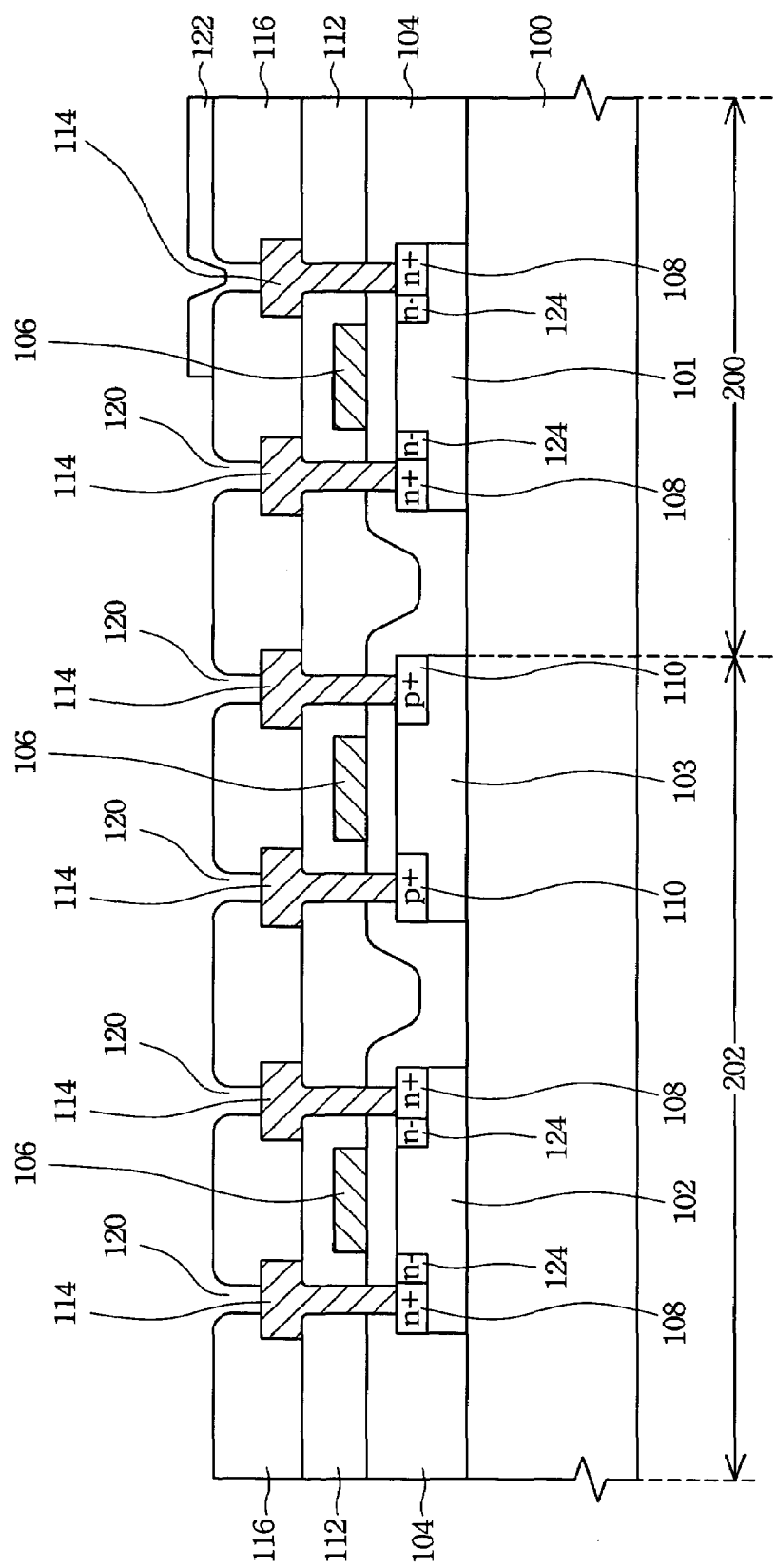
FIG. 1 is a cross-sectional view of a transparent substrate illustrating the structure of a thin film transistor and a peripheral CMOS transistor control circuit in a TFT-LCD in accordance with the prior art.
Figure 2A:
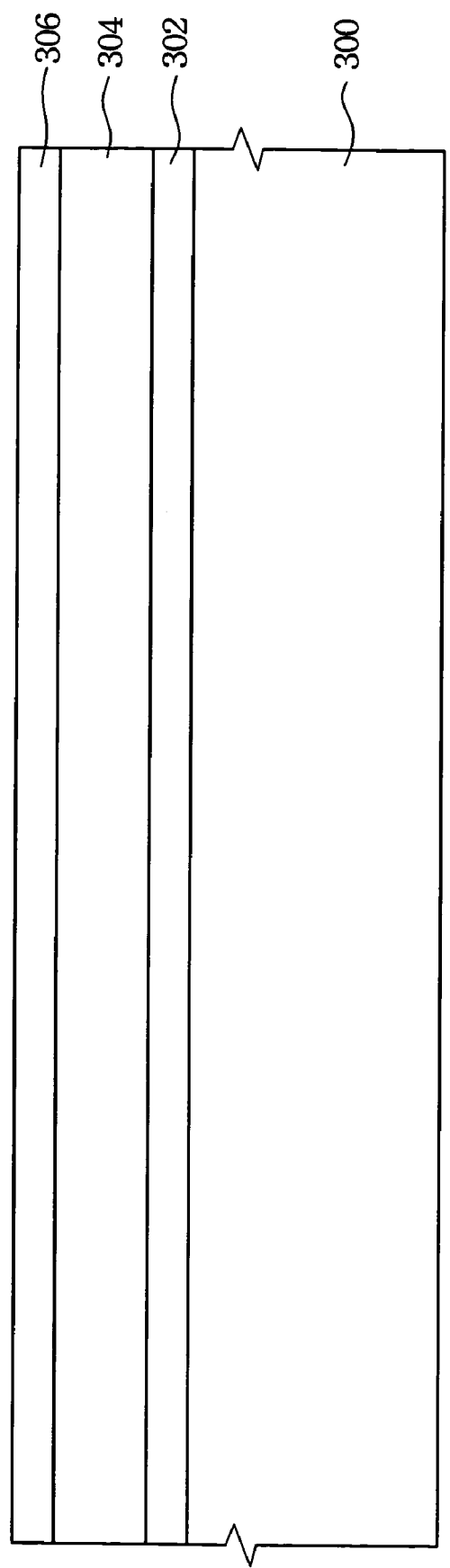
FIG. 2A is a cross-sectional view of a transparent substrate illustrating the steps of forming the transparent conductive layer, the metal layer and the heavily doped layer sequentially over the substrate in accordance with the present invention.

In FIG. 2A, a transparent insulating substrate is illustrated, which is comprised of a glass, a quartz, or the like. In this embodiment, the transparent insulating substrate is a glass substrate 300. Next, an indium tin oxide (ITO) layer is formed on the glass substrate 300 to serve as a transparent conductive layer 302. The transparent conductive layer 302 with a thickness of between 800 and 1100 angstroms can be formed by sputtering at between 25 and 100° C. Next, a metal layer 304 is formed to serve as the electrode of the source/drain structure. In an embodiment, the first metal layer 304 with a thickness of between 1000 to 8000 angstroms can be formed by sputtering at between 25 and 100° C. Typically, the material of the metal layer 304 can be chosen from the group consisting of chromium (Cr), tungsten (W), titanium (Ti), tantalum (Ta), molybdenum (Mo), aluminum (Al), copper (Cu) and various alloys. Then, a heavily doped layer 306 is formed over the metal layer 304 to serve as the source/drain regions of the thin film transistors and the NMOS transistors of the peripheral CMOS transistor control circuit. An N+ doped silicon layer is used to form the heavily doped layer 306. In an embodiment, the N+ doped silicon layer with a thickness of between 300 and 2000 angstroms and a concentration of between $1 \times 10^{14}$ and $1 \times 10^{16}$ atom/cm$^2$ is formed by chemical vapor deposition (CVD).

Figure 2B:
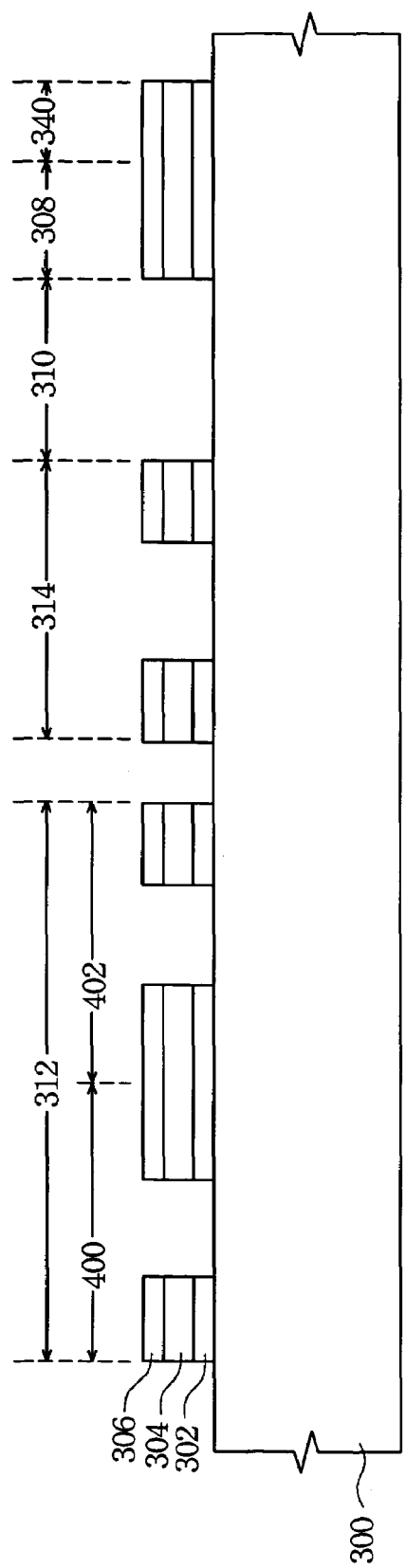
FIG. 2B is a cross-sectional view of a transparent substrate illustrating the step of etching the transparent conductive layer, the metal layer and the heavily doped layer in accordance with the present invention.

In FIG. 2B, a first photolithography process is performed to define the heavily doped layer 306. Then, an etching process is performed to partially remove the transparent conductive layer 302, the metal layer 304 and the heavily doped layer 306 so as to define the source/drain regions of the transistor region 314 and of the peripheral CMOS transistor control circuit region 312. The reflection region 310, the transmission region 308 and the capacitor region 340 can be concurrently defined by this etching process. Furthermore, a dry etching method and a wet etching method can both be used in this etching process. In an embodiment, these layers are wet etched by using a solution of HCl and HNO$_3$ or a solution of HCl and FeCl$_2$.

Figure 3A:
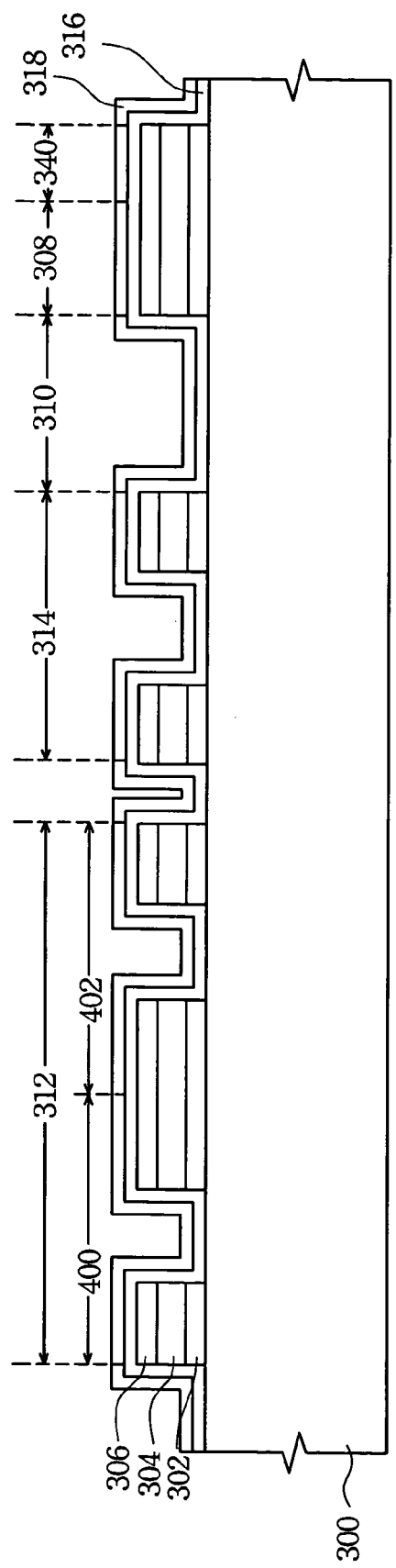
FIG. 3A is a cross-sectional view of a transparent substrate illustrating the steps of forming the polysilicon layer and the insulating layer in accordance with the present invention.

In FIG. 3A, a polysilicon layer 316 is formed over the heavily doped layer 306 and the glass substrate 300 to serve as the channel of the transistor region 314 and of the peripheral CMOS transistor control circuit region 312. In an embodiment, an amorphous silicon layer with a thickness of between 500 and 600 angstroms is first deposited over the heavily doped layer 306 and over the glass substrate 300. Then, this amorphous silicon layer is converted to a polysilicon layer 316 by applying energy, such as that provided by an annealing process. Next, an insulating layer 318 is formed over the polysilicon layer 316 to serve as the gate insulating layer of the gate structure. In an embodiment, the insulating layer is comprised of silicon oxide. The silicon oxide layer with a thickness of between 500 and 2000 angstroms can be formed by plasma enhanced chemical vapor deposition (PECVD).

Figure 3B:
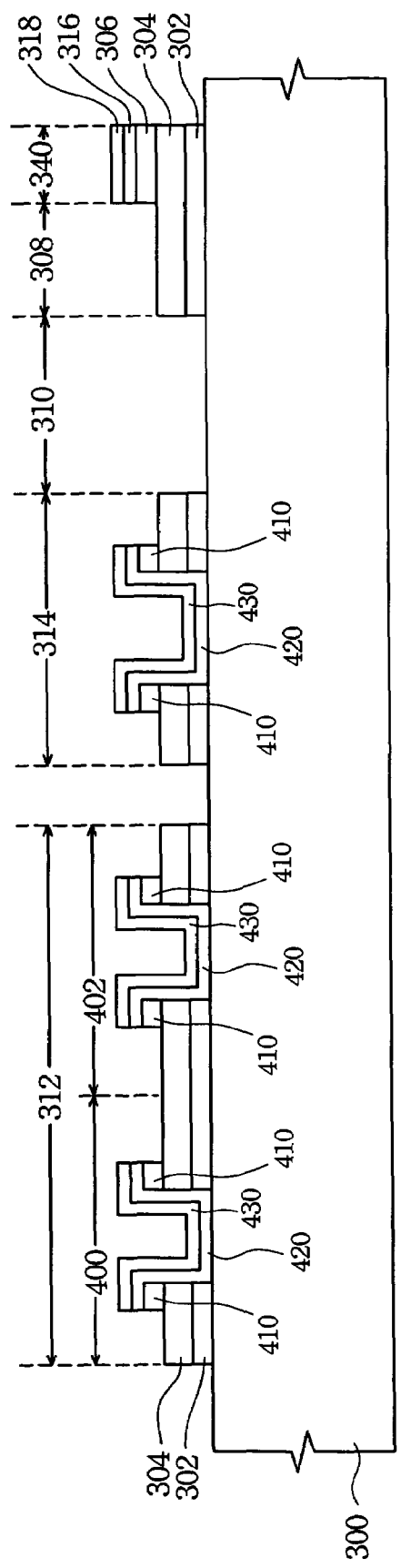
FIG. 3B is a cross-sectional view of a transparent substrate illustrating the step of etching the polysilicon layer and the insulating layer in accordance with the present invention.

In FIG. 3B, a second photolithography process is performed to define the insulating layer 318. Then, an etching process is performed to partially remove the polysilicon layer 316, the insulating layer 318 and the heavily doped layer 306 so as to define the source/drain region 410, the channel region 420 and the gate insulating layer 430 of the transistor region 314 and of the peripheral CMOS transistor control circuit region 312. In an embodiment of the present invention, a dry etching method is used to remove the polysilicon layer 316, the insulating layer 318 and the heavily doped layer 306.

Figure 4A:
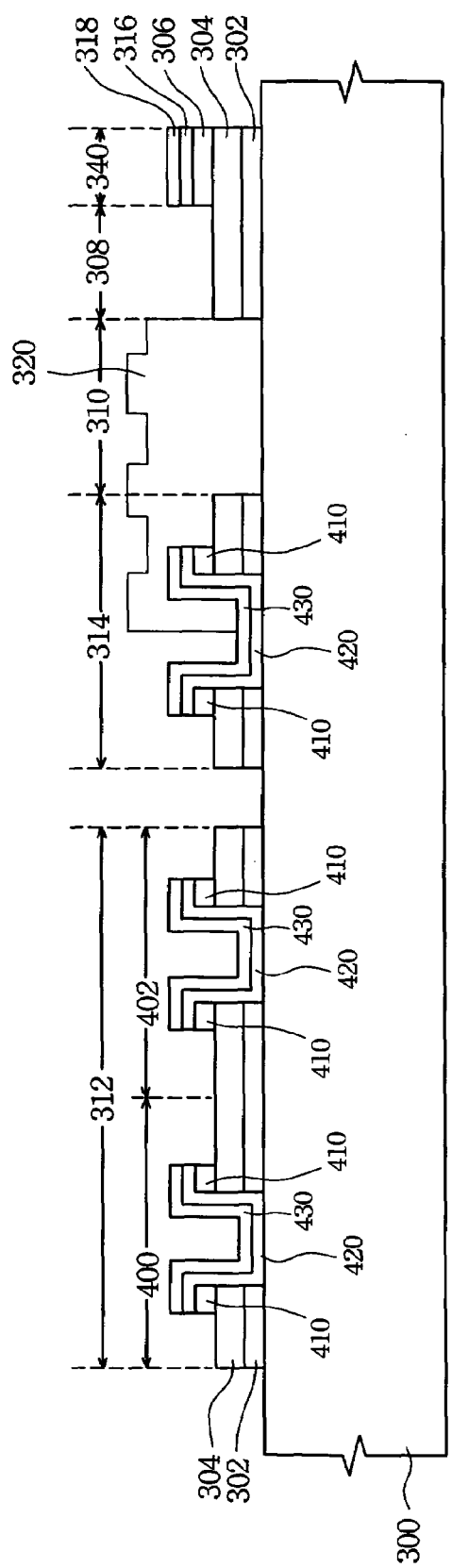
FIG. 4A is a cross-sectional view of a transparent substrate illustrating the step of depositing a resin layer in accordance with the present invention.

In FIG. 4A, a resin layer 320, comprising a photosensitive material, is deposited over the glass substrate 300, the insulating layer 318, the metal layer 304 and the gate insulating layer 430. Then, a third photolithography process is performed to make the surface of the resin layer 320 non-uniform as shown in the FIG. 4A. Next, an etching process is performed to partially or totally remove the resin layer 320 located in the transistor region 314, the peripheral CMOS transistor control circuit region 312, the transmission region 308 and the capacitor region 340.

Figure 4B:
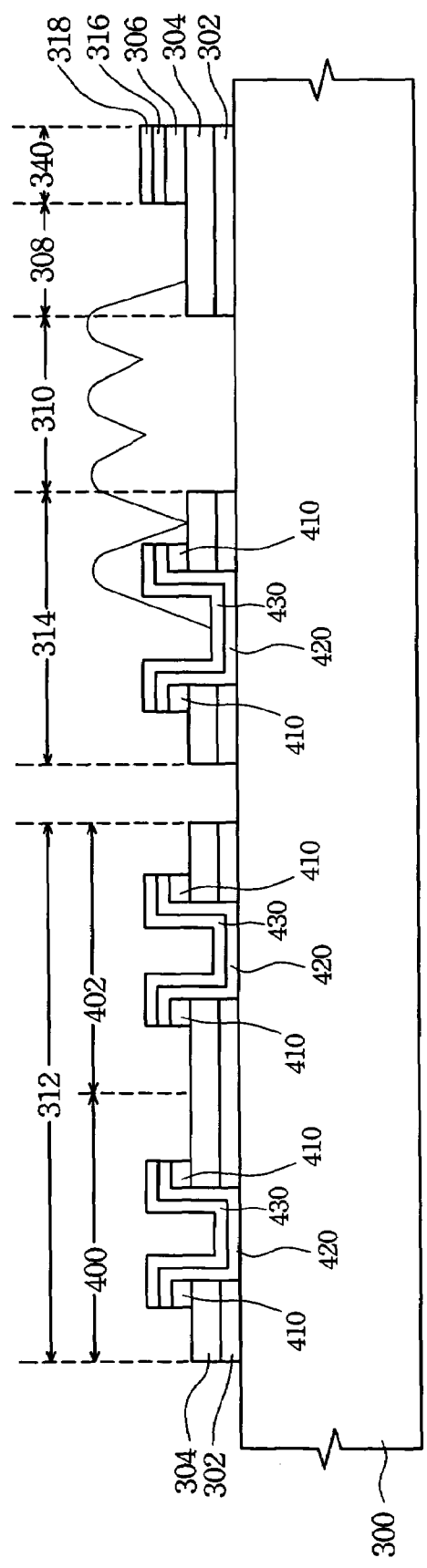
FIG. 4B is a cross-sectional view of a transparent substrate illustrating the step of performing a thermal process to smooth the surface of the resin layer in accordance with the present invention.

In FIG. 4B, a thermal process with a temperature of about 200° C. and lasting about 1 hour is performed to soften the resin so as to form a smooth surface on the resin layer 320.

Figure 5A:
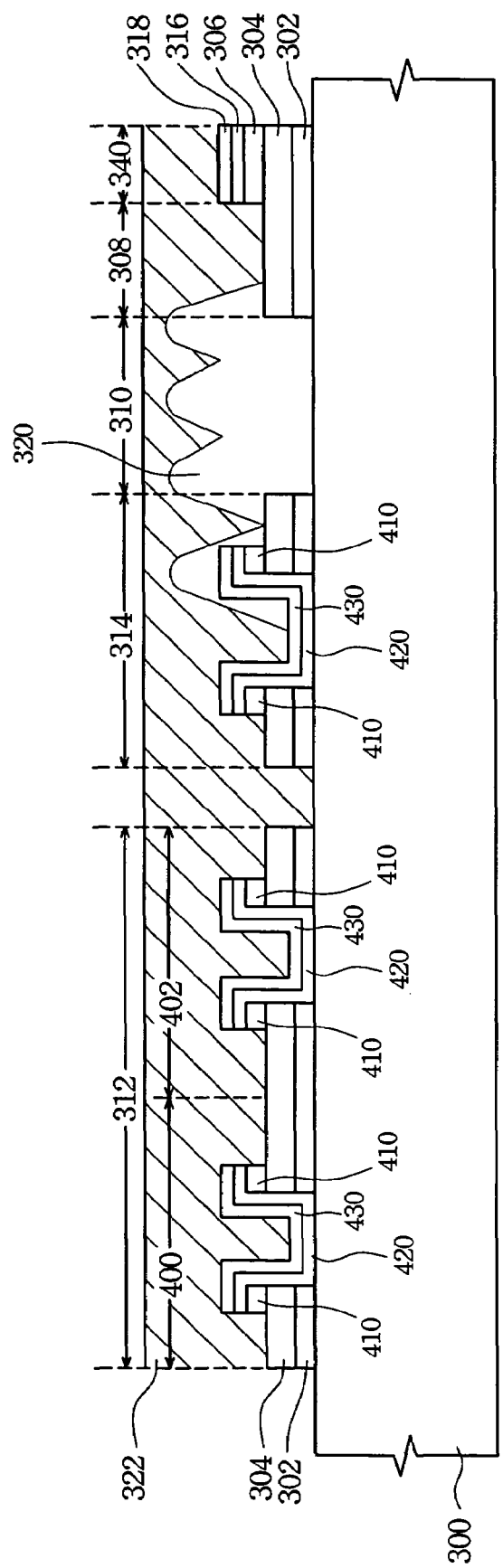
FIG. 5A is a cross-sectional view of a transparent substrate illustrating the step of forming the gate electrode and the reflection electrode in accordance with the present invention.
Figure 5B:
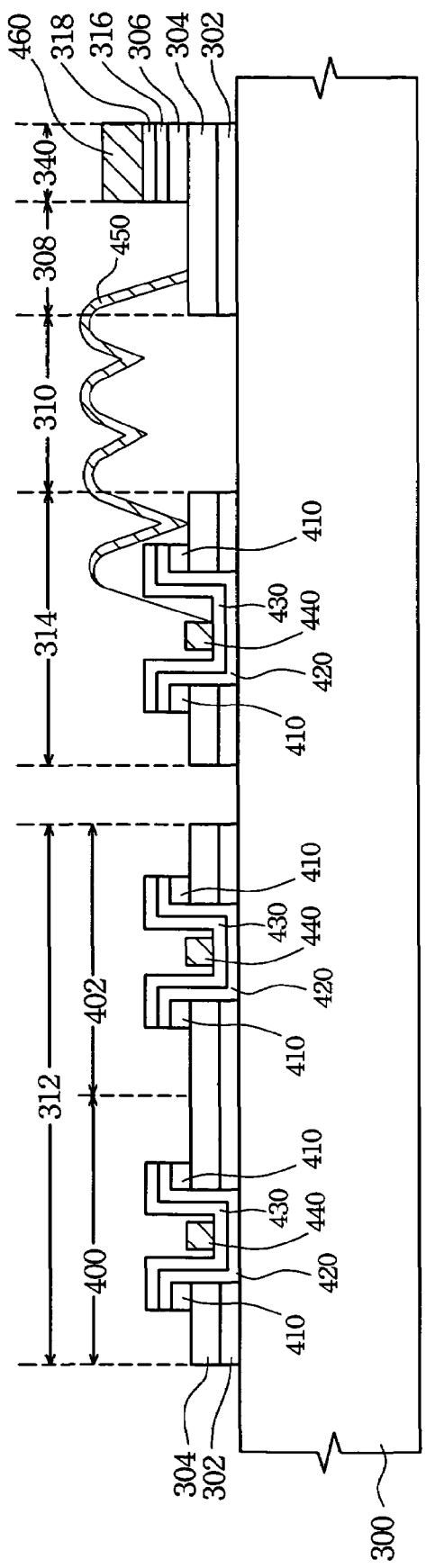
FIG. 5B is a cross-sectional view of a transparent substrate illustrating the thin film transistor structure in accordance with the present invention.

In FIGS. 5A and 5B, a metal layer 322 is formed over the resin layer 320, the insulating layer 318 and the gate insulating layer 420. The metal layer 322 located in the transistor region 314 and in the peripheral CMOS transistor control circuit region 312 is used to form the gate electrode structure 440. The metal layer 322 located in the reflection region 310 is used to form the reflection electrode 450. The metal layer 322 located in the capacitor region 340 is used to form a metal electrode of a capacitor. In general, the metal layer 322 is comprised of aluminum alloy, such as a Mo—Al alloy or an Al—Nd alloy.

A fourth photolithography process is performed to define the metal layer 322. Then, an etching process is performed to partially remove the metal layer 322 so as to define the gate electrode structure 440, the reflection electrode 450 and the metal electrode 460 of a capacitor. It is noticed that the metal layer 322 also can be used as the conductive line between the PMOS transistor and the NMOS transistor in the peripheral CMOS transistor control circuit region 312. In an embodiment, a chlorine-based plasma is used to etch the metal layer 322.

Figure 6:
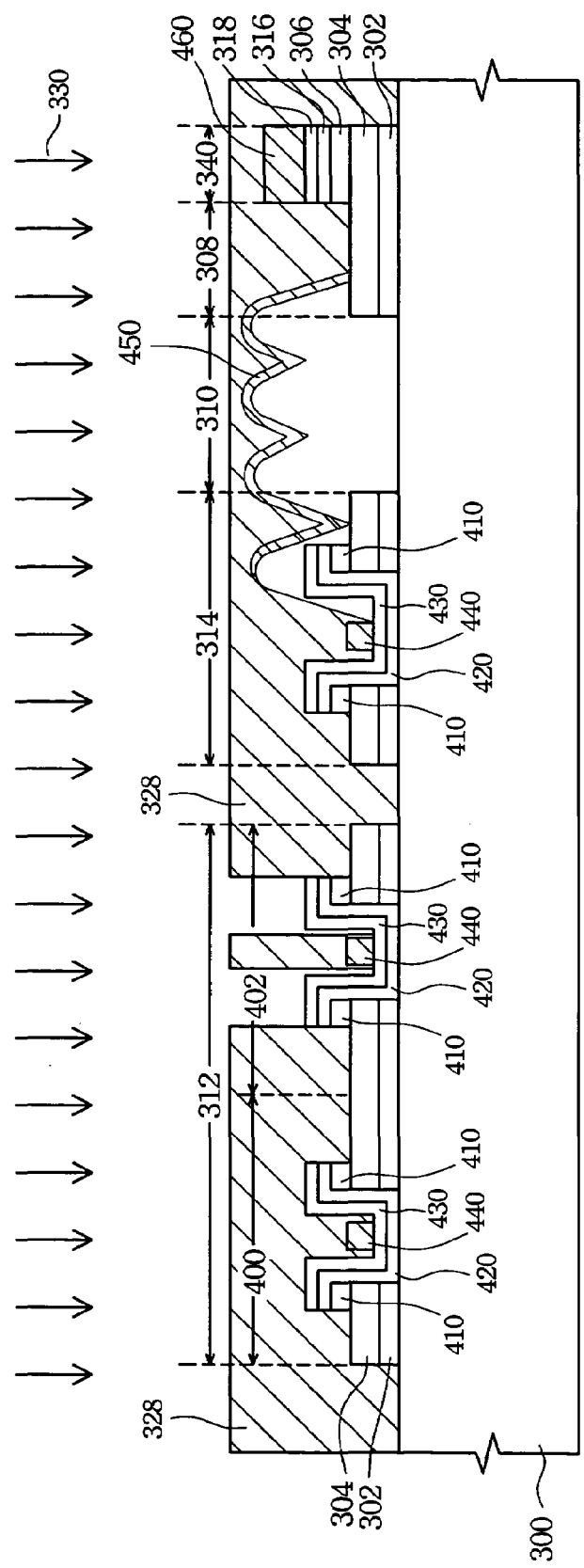
FIG. 6 is a cross-sectional view of a transparent substrate illustrating the step of ion implantation to form the source/drain region of a PMOS transistor in accordance with the present invention.

In FIG. 6, a fifth photolithography process is performed to create a patterned photoresist layer 328 in order to expose the source/drain region 410 of the PMOS transistor in the peripheral CMOS transistor control circuit region 312. Then, P-type ion implantation, following the arrow direction 330, is performed to convert the dopant type of the source/drain region 410 of the PMOS transistor from N+ type to P+ type using the patterned photoresist layer 328 as a mask. Preferably, the energy and the dosage of the ion implantation are from about 60 keV to 70 keV and about $10^{17}$/cm$^2$, respectively.

Figure 7A:
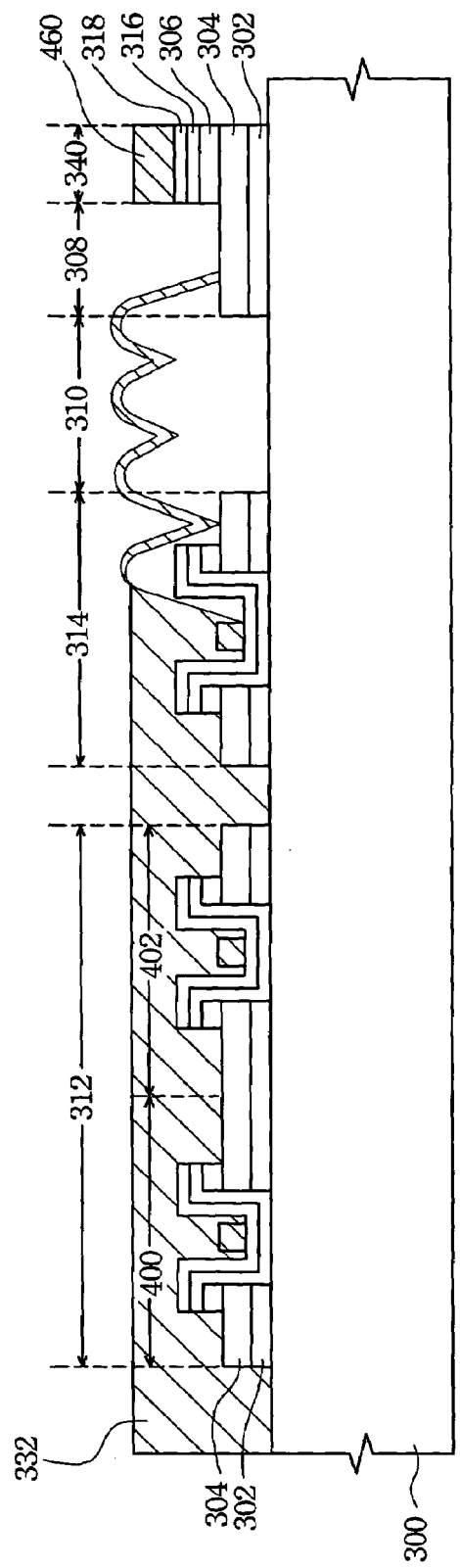
FIG. 7A is a cross-sectional view of a transparent substrate illustrating the step of forming the passivation layer in accordance with the present invention.

In FIG. 7A, the photoresist layer 328 is removed. A passivation layer 332 is formed over the peripheral CMOS transistor control circuit region 312, the transistor region 314, the reflection region 310 and the glass substrate 300. The passivation layer 332 can be chosen from the group consisting of oxide, nitride and oxynitride compounds. In an embodiment, the layer is silicon oxide or silicon nitride with a thickness of between 3000 and 4000 angstroms and can be formed by using plasma chemical vapor deposition (PECVD). The reaction gases for forming the silicon oxide or silicon nitride layer can be SiH$_4$, NH$_3$, N$_2$ and N$_2$O or SiH$_2$Cl$_2$, NH$_3$, N$_2$ and N$_2$O. A sixth photolithography process is performed to pattern the passivation layer 332 so as to expose the transmission region 308. In an embodiment, the passivation layer 332 is etched by using a solution of CF$_4$/H$_2$, CHF$_3$ or CH$_3$CHF$_2$.

Figure 7B:
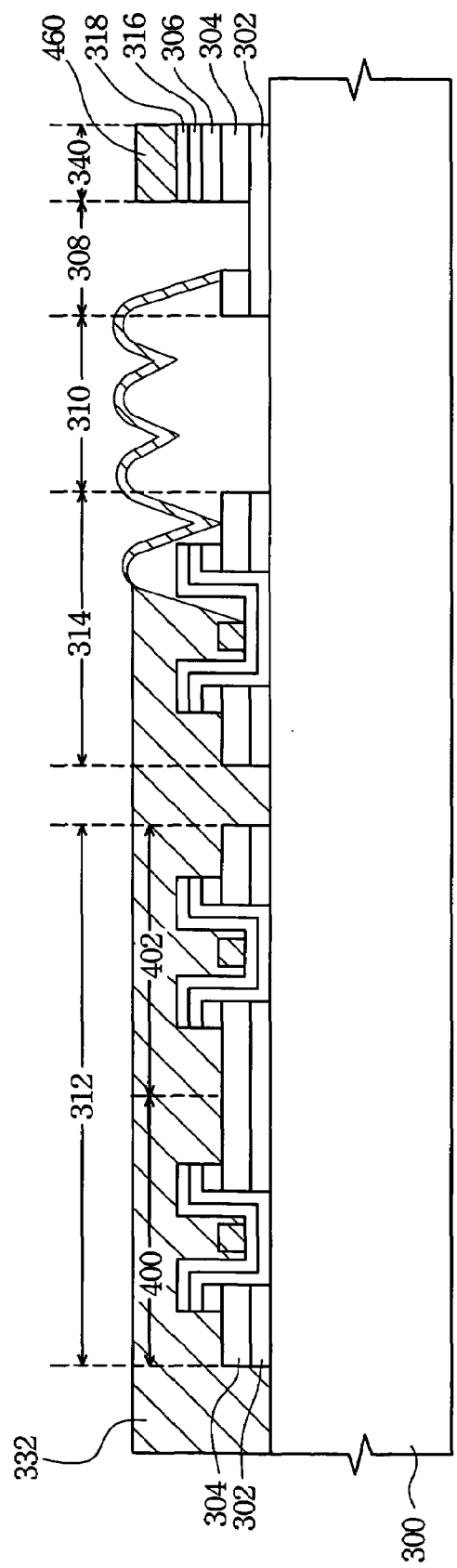
FIG. 7B is a cross-sectional view of a transparent substrate illustrating the step of partially removing the metal layer in the transmission region to expose the transparent conducting layer in accordance with the present invention.

In FIG. 7B, an etching process is performed in the transmission region 308. In an embodiment, a dry etching method or a wet etching method is used to etch the metal layer 304 to expose the transparent conductive layer 302.

FIG. 7B is a cross-sectional view of a partial liquid crystal display with the transistor region 314, the peripheral CMOS transistor control circuit region 312, the transistor region 314, the reflection region 310 and the capacitor region 340. The pixel electrode in the transistor region 314 controls the reflection region 310 and the transmission region 308. In other words, partial incident light passes through the transmission region and other incident light is reflected by the reflection region, thus maximizing the light-utilization efficiency in the two regions.

The peripheral CMOS transistor control circuit region 312 and the transistor region 314 are both formed on the substrate 300. Therefore, these two regions are integrated more easily.

It is noticed that the transparent conductive layer 302 is located at the bottom. The metal layer 304 and the heavily doped layer 306 are sequentially formed over the transparent conductive layer 302. The heavily doped layer 306 can be used to form the source/drain structure, and the transparent conductive layer 302 can be used to serve as the data line. Therefore, it is not necessary to etch the passivation layer 332 to form a contact hole for connecting the source/drain structure to the data line. In other words, the source/drain structure can be connected to the data line through the metal layer and the metal layer can be defined by the first photolithography process.

As a whole, the present invention can provide various benefits. First, only six lithography steps are required to manufacture the peripheral CMOS transistor control circuit region 312, the capacitor region 340 and the transistor region 314. Thus, the complexity, the cost and the process cycle time of forming the TFT device are lowered. Second, the liquid crystal display with transmission and reflection regions can maximize the light-utilization efficiency. In addition, the metal layer 304 and the heavily doped layer 306 are sequentially formed over the transparent conductive layer 302. The heavily doped layer 306 can be used to form the source/drain structure, and the transparent conductive layer 302 can be used to serve as the data line. The metal layer can be defined for connecting the source/drain structure to the data line. Therefore, it is not necessary to etch the passivation layer to form a contact hole.

As is understood by a person skilled in the art, the foregoing embodiment of the present invention is illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

While the embodiment of the invention has been illustrated and described, it will be appreciated that various changes can be made therein without departing from the spirit and scope of the invention.

What is claimed is:

1. A method of manufacturing a liquid crystal display, wherein said method comprises the following steps of:
    providing a substrate;
    forming a conductive layer over said substrate;
    forming a first metal layer over said conductive layer;
    forming a heavily doped layer over said first metal layer;
    patterning said heavily doped layer, said first metal layer and said conductive layer to define a peripheral circuit region, a transistor region, a reflection region, a transmission region and a capacitor region;
    forming a semiconductor layer over said substrate and said heavily doped layer;
    forming an insulating layer over said semiconductor layer;
    patterning said insulating layer, said semiconductor layer and said heavily doped layer to define a source/drain region and a channel region and to partially expose said first metal layer;
    forming a resin layer over said substrate, said first metal layer and said insulating layer;
    patterning said resin layer to form a non-uniform surface on said reflection region;
    performing a thermal process to soften said non-uniform surface to form a smooth surface;
    forming a second metal layer over said resin layer, said substrate, said first metal layer and said insulating layer;
    patterning said second metal layer to define a gate electrode substrate, a reflection electrode and a capacitor electrode;
    forming a patterned photoresist layer over said gate electrode substrate, said reflection electrode, said substrate, said first metal layer, said capacitor electrode and said insulating layer;
    performing an ion implantation into said source/drain region located in said peripheral circuit region using said patterned photoresist layer as a mask;
    removing said patterned photoresist layer;
    forming a passivation layer over said gate electrode structure, said reflection electrode, said substrate, said first metal layer, said capacitor electrode and said insulating layer;
    patterning said passivation layer to expose said transmission region; and
    etching partial said first metal layer to expose said conductive layer.

2. The method of claim 1, wherein said heavily doped layer is of N-type doping.

3. The method of claim 1, wherein said heavily doped layer is of P-type doping.

4. The method of claim 3, wherein the energy and the dosage of said implantation of said P-type ion are from about 60 keV to 70 keV and about $10^{17}/cm^2$, respectively.

5. The method of claim 1, wherein the thickness of said heavily doped layer is between 300 and 2000 angstroms.

6. The method of claim 1, wherein the thickness of said insulating layer is between 500 and 2000 angstroms.

7. The method of claim 1, wherein the thickness of said semiconductor layer is between 500 and 600 angstroms.

8. The method of claim 1, wherein the temperature and the time of the step of said performing a thermal process is about 220° C. and 1 hour, respectively.

9. The method of claim 1, wherein the material of said second metal layer is selected from the group consisting of Mo—Al alloys and Al—Nd alloys.

10. A method of manufacturing a peripheral circuit region, a transistor region, a reflection region, a transmission region and a capacitor region over a substrate of a liquid crystal display, said method comprising the following steps of:
    forming a conductive layer over said substrate;
    forming a first metal layer over said conductive layer;
    forming an N+ doped layer over said first metal layer;
    patterning said N+ doped layer, said first metal layer and said conductive layer to define said peripheral circuit region, said transistor region, said reflection region, said transmission region and said capacitor region;
    forming a semiconductor layer over said substrate and said N+ doped layer;
    forming an insulating layer over said semiconductor layer;
    patterning said insulating layer, said semiconductor layer and said N+ doped layer to define a source/drain region, a gate insulating layer and a channel region and to partially expose said first metal layer;
    forming a resin layer over said substrate, said first metal layer, said gate insulating layer and said insulating layer;
    patterning said resin layer to form a non-uniform surface on said reflection region;
    performing a thermal process to soften said non-uniform surface to form a smooth surface;

forming a second metal layer over said resin layer, said substrate, said first metal layer and said insulating layer;

patterning said second metal layer to define a gate electrode substrate, a reflection electrode and a capacitor electrode;

forming a patterned photoresist layer over said gate electrode substrate, said reflection electrode, said substrate, said first metal layer, said gate insulating layer, said capacitor electrode and said insulating layer to partially expose the source/drain region in said peripheral circuit region;

performing a P-type ion implantation into said source/drain region located in said peripheral circuit region using said patterned photoresist layer as a mask;

removing said patterned photoresist layer;

forming a passivation layer over said gate electrode structure, said reflection electrode, said substrate, said first metal layer, said capacitor electrode, said gate insulating layer and said insulating layer;

patterning said passivation layer to expose said transmission region; and etching partial said first metal layer to expose said conductive layer.

11. The method of claim 10, wherein the thickness of said first metal layer is between 1000 and 8000 angstroms.

12. The method of claim 10, wherein the thickness of said conductive layer is between 800 and 1100 angstroms.

13. The method of claim 10, wherein the thickness of said N+ doped layer is between 300 and 2000 angstroms.

14. The method as claim 10, wherein the thickness of said insulating layer is between 500 and 2000 angstroms.

15. The method of claim 10, wherein the thickness of said semiconductor layer is between 500 and 600 angstroms.

16. The method of claim 10, wherein the temperature and the time of the step of said performing a thermal process is about 220° C. and 1 hour, respectively.

17. The method of claim 10, wherein the material of said second metal layer is selected from a group consisting of Mo—Al alloys and Al—Nd alloys.

18. The method of claim 10, wherein the energy and the dosage of said P-type ion implantation are about 60 keV to 70 keV and about $10^{17}/cm^2$, respectively.

* * * * *